(12) United States Patent
MacDougal et al.

(10) Patent No.: US 8,324,659 B2
(45) Date of Patent: Dec. 4, 2012

(54) INGAASSBN PHOTODIODE ARRAYS

(75) Inventors: Michael MacDougal, Camarillo, CA (US); Jonathan Geske, Ventura, CA (US); John E. Bowers, Goleta, CA (US)

(73) Assignee: Aerius Photonics LLC, Ventura, CA (US)

( * ) Notice: Subject to any disclaimer, the term of this patent is extended or adjusted under 35 U.S.C. 154(b) by 0 days.

(21) Appl. No.: 13/070,829

(22) Filed: Mar. 24, 2011

(65) Prior Publication Data

US 2011/0169048 A1 Jul. 14, 2011

Related U.S. Application Data

(63) Continuation of application No. 12/254,634, filed on Oct. 20, 2008, now Pat. No. 7,915,639.

(51) Int. Cl.
*H01L 31/102* (2006.01)

(52) U.S. Cl. ............... 257/184; 257/189; 257/E31.019; 438/48

(58) Field of Classification Search ......................... None
See application file for complete search history.

(56) References Cited

U.S. PATENT DOCUMENTS 7,091,527 B2 * 8/2006 Yoneda et al. ................. 257/186

OTHER PUBLICATIONS

Nakagawa et al., "Electroluminescence of InGaAsSbN quantum well diodes grown on InP substrates", 2004 International Conference on Indium Phosphide and Related Materials Conference Proceedings 16th IPRM 31, May-Jun. 4, 2004, Kogoshima, Japan.*

* cited by examiner

*Primary Examiner* — Julio J Maldonado
*Assistant Examiner* — Sonya McCall Shepard
(74) *Attorney, Agent, or Firm* — Haynes and Boone, LLP

(57) ABSTRACT

Embodiments of detectors made using lattice matched photoabsorbing layers are disclosed. A photodiode apparatus in accordance with one or more embodiments of the present invention comprises an indium phosphide substrate, and a photoabsorbing region comprising at least an indium gallium arsenide antimonide nitride (InGaAsSbN) layer, wherein the InGaAsSbN layer has a thickness of at least 100 nanometers and is nominally lattice-matched to the indium phosphide substrate.

18 Claims, 7 Drawing Sheets

INGAASSBN PHOTODIODE ARRAYS

CROSS-REFERENCE TO RELATED APPLICATIONS

This application is a continuation of U.S. patent application Ser. No. 12/254,634, filed Oct. 20, 2008, entitled "InGaAsSbN PHOTODIODE ARRAYS," which application is incorporated by reference herein.

BACKGROUND OF THE INVENTION

1. Field of the Invention

This invention relates generally to light detection and photodiode arrays, and in particular to arrays made from indium gallium arsenide and related materials.

2. Description of the Related Art

To extend the wavelength range of $In_xGa_{1-x}As$ detectors, the normal approach is to increase the Indium composition, or the x value [K. Ling a, G. Olsen, V. Ban, A. Joshi, W. Kosonocky, "Dark current analysis and characterization of $In_xGa_{1-x}As/InAs_yP_{1-y}$ graded photodiodes with x>0.53 for response to longer wavelengths (>1.7 microns), Journal of Lightwave Technology, vol. 10, pp. 1050-2 (1992)], which is incorporated by reference herein.

FIG. 1 illustrates a description of this approach, where the substrate InP 1 has a buffer layer of InGaAs 2 followed by the absorption layer InGaAs 3, followed by an InP cap 4. The InGaAs absorber 3 has a x-value that is greater than 0.53, and therefore is no longer lattice-matched with the InP substrate 1.

FIG. 2 illustrates the relationship of the x-value in InGaAs with the lattice-matching to InP substrate and the emission wavelength. By increasing the x-value from 0.53, the wavelength range is extended, but again, the material is no longer lattice-matched to the InP substrate 1. Because the material is no longer lattice-matched, dislocation defects are created in the material, which increase the dark current by several orders of magnitude over what the material should achieve theoretically. The InGaAs buffer layer 2 is used to reduce the number of defects, but they cannot be completely eliminated because they propagate through the grown layer into the absorber. The InGaAs buffer layer 2 also limits the short wavelength range which is normally limited by InP to a wavelength of 920 nm. The InGaAs buffer layer 2 can increase the short wavelength to 1100 nm or higher, which is undesirable because it decreases the overall wavelength range from the detector.

Other approaches have been made to extend the wavelength range in materials grown on InP substrates and GaAs substrates. One approach is to add Nitrogen to the InGaAs [D. Serries, T. Geppert, P. Ganser, M. Maier, K. Kohler, N. Herres, and J. Wagner, "Quaternary GaInAsN with high In content: Dependence of band gap energy on N content," Applied Physics Letters, vol 80, no 14, pp. 2448-50], which is incorporated by reference herein. By growing thin layers of InGaAsN on InP, it has been demonstrated that the bandgap can be decreased to 590 meV, equivalent to a wavelength emission of 2.1 microns. However, the material exhibits poor photoluminescence which is indicative of a high concentration of defects.

Another approach introduces antimony (Sb) along with N to form InGaAsSbN to improve the photoluminescence [X. Yang, M. Jurkovic, J. Heroux, and W. Wang, "Molecular beam epitaxial growth InGaAsN:Sb/GaAs quantum wells for long-wavelength semiconductor lasers", Applied Physics Letters, vol 75, no 2, pp. 178-80], which is incorporated by reference herein. The Sb is thought to act as a surfactant for the N and creates growth conditions that are more favorable for low defect growth, and devices made with such methods demonstrate laser emission wavelengths beyond 1 micron.

Thin layers of InGaAsSbN have been grown on InP to demonstrate extension of the laser emission wavelength [J. Fu, S. Bank, M. Wistey, H. Yuen, J. Harris, Jr., "Solid-source molecular-beam epitaxy growth of GaInNAsSb/InGaAs single quantum well on InP with photoluminescence peak wavelength at 2.04 microns," Journal of Vacuum Science Technology B, vol. 22, no 3, pp. 1463-7], which is incorporated by reference herein. By using both N and Sb added to InGaAs, an extension of the wavelength from 1.7 microns to 2.04 microns was achieved, however, previous attempts to grow this material resulted in layers that are thin and strained, and therefore would not be useful for thick layer devices such as photodetectors.

It can be seen, then, that there is a need in the art for a lattice-matched material that has an extended wavelength response. It can also be seen that there is a need in the art for growing thick-layer compositions on InP to produce devices. It can also be seen that there is a need in the art to reduce dislocation defects in such devices to decrease the dark current.

SUMMARY OF THE INVENTION

To minimize the limitations in the prior art, and to minimize other limitations that will become apparent upon reading and understanding the present specification, the present invention discloses a semiconductor device comprised of several layers, wherein the photoabsorbing layer is a thick (>0.1 micron), lattice-matched layer that can be used for the detection of infrared light.

A photodiode apparatus in accordance with one or more embodiments of the present invention comprises an indium phosphide substrate, and a photoabsorbing region comprising at least an indium gallium arsenide antimonide nitride (InGaAsSbN) layer, wherein the InGaAsSbN layer has a thickness of at least 100 nanometers and is nominally lattice-matched to the indium phosphide substrate.

Such a photodiode apparatus further optionally comprises the photoabsorbing region having a cutoff wavelength greater than 1.7 microns, the cutoff wavelength being measured at 25 degrees celsius, the cutoff wavelength being less than 3 microns, the thickness of the InGaAsSbN layer being between 0.05 microns and 7 microns, the InGaAsSbN layer comprising a concentration of 0.5% to 15% of antimonide, the InGaAsSbN layer comprising a concentration of 0.5% to 15% of nitrogen, the InGaAsSbN layer comprising a concentration greater than 40% of indium, and the indium phosphide substrate being substantially removed.

Another photodiode apparatus in accordance with one or more embodiments of the present invention comprises an indium phosphide substrate, a first layer region coupled to the indium phosphide, the first layer comprising at least a layer of indium phosphide doped n-type material, a second layer region, coupled to the first layer region, the second layer region comprising at least an indium gallium arsenide antimonide nitride (InGaAsSbN) layer, the InGaAsSbN layer having a thickness of at least 100 nanometers and being nominally lattice-matched to said substrate, a third layer region comprising a layer of indium phosphide, a fourth layer region comprising a patterned p-type layer of indium gallium arsenide, and a fifth layer region comprising a dopant diffused region which extends from said third layer region into said second layer region.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Figure 1:
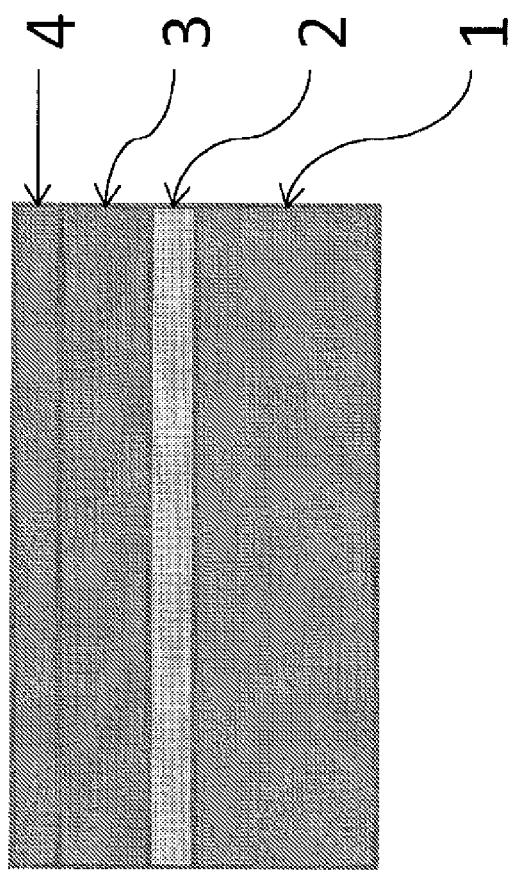
FIG. 1 illustrates a device having an increase in the Indium composition.
Figure 2:
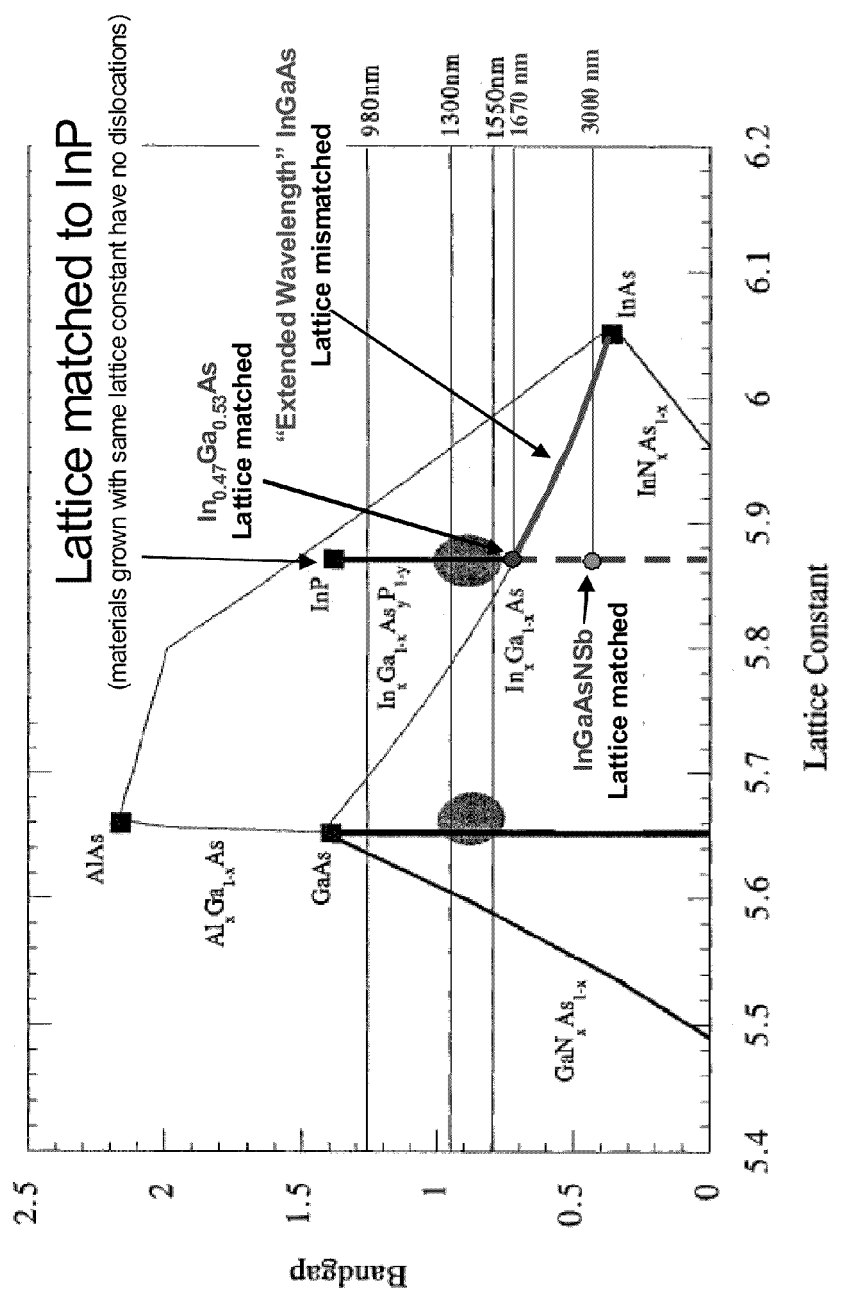
FIG. 2 illustrates the relationship of the x-value in InGaAs with the lattice-matching to InP substrate and the emission wavelength.
Figure 3:
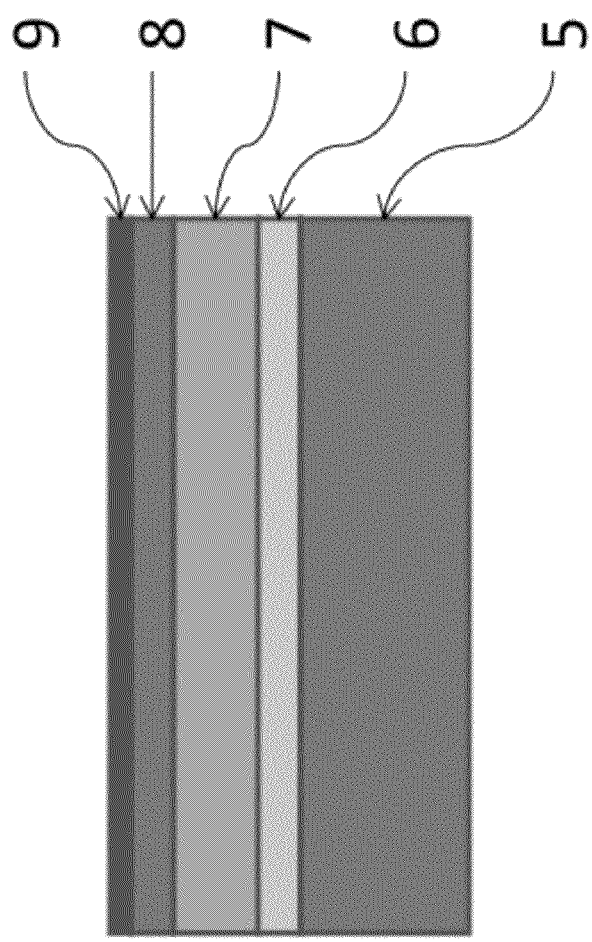
FIG. 3 illustrates a preferred embodiment of the present invention.

A preferred embodiment of the invention is shown in FIG. 3. An n-type InP buffer layer 6 that is 1 micron thick is grown on an n-type InP substrate 5. A 3.5 micron thick layer of InGaAsSbN 7 is grown on top of the buffer layer 6. Layer 7 is grown with light n-doping. A 1 micron thick InP layer 8 is grown on top of the photoabsorbing layer 7. Depending on the application, a 0.2 micron layer of InGaAs 9 is grown on top of InP layer 8 to provide a low-resistance Ohmic contact.

By using a preferred combination of constituent atoms, the $In_xGa_{1-x}As_{1-y-z}Sb_yN_z$ can be grown with a cutoff wavelength beyond 3 micron and still remain lattice-matched to the substrate 5. The material can be grown in a number of ways, and is typically grown through epitaxial growth, such as metal-organic chemical vapor deposition or molecular beam epitaxy, but other methods can be used within the scope of the present invention.

One embodiment to achieve lattice-matching is to iteratively approach the material beginning with In0.53Ga0.47As, which is lattice-matched to InP. In the next run, the Indium and Gallium source flows are kept the same as the previous run, and N and Sb are introduced at a ratio of 1:2.6. This ratio is derived from Vegard's law. As a starting point, 2% Sb would be used, which gives an N composition of 5.2%. After the growth, the layer is annealed at 650-750° C. for 1-10 minutes to remove defects. The layer is analyzed by photoluminescence and x-ray diffraction. X-ray diffraction illustrates the lattice-mismatch. If the lattice mismatch is tensile then Sb flow would be increased, and if the lattice mismatch is compressive, then N flow would be increased. The change in flow would be proportional to the difference in lattice mismatch. Another growth with new flows would be performed and characterized. This process would continue until lattice matching is achieved. Lattice matching is often defined as a difference in layer x-ray peak and substrate x-ray peak by less than 400 arc sec.

Once lattice matching has been achieved, the photoluminescence peak wavelength will likely be approximately 2 microns. For further increase in the emission wavelength, the Indium is typically increased. If the Indium is increased without changes to the As, Sb, or N flows, the mismatch between the lattice constant of the layer and the substrate will be large. To compensate for the increase in Indium composition, the Nitrogen composition also increases; however, the As composition, and Sb composition will stay the same. While the increase in N composition will extend the wavelength, it offsets the strain caused by increased Indium flow. To achieve a wavelength of 2.5 microns, the Indium composition needs to increase to 75% (from 53%), and the N needs to increase to 8% (from approximately 2%), or $In_{0.75}Ga_{0.25}As_{0.82}Sb_{0.05}N_{0.08}$. These numbers are approximate, and again, photoluminescence and x-ray diffraction can be used to iteratively achieve the wavelength and lattice-matching desired. Once the desired wavelength has been achieved, the layer can be grown in the device structure shown in FIG. 3. If the photoluminescence measures a wavelength of 2.5 micron of the given layer, the range of photon wavelengths to which the detector will be sensitive is from 0.92 microns to 2.5 microns.

Figure 4:
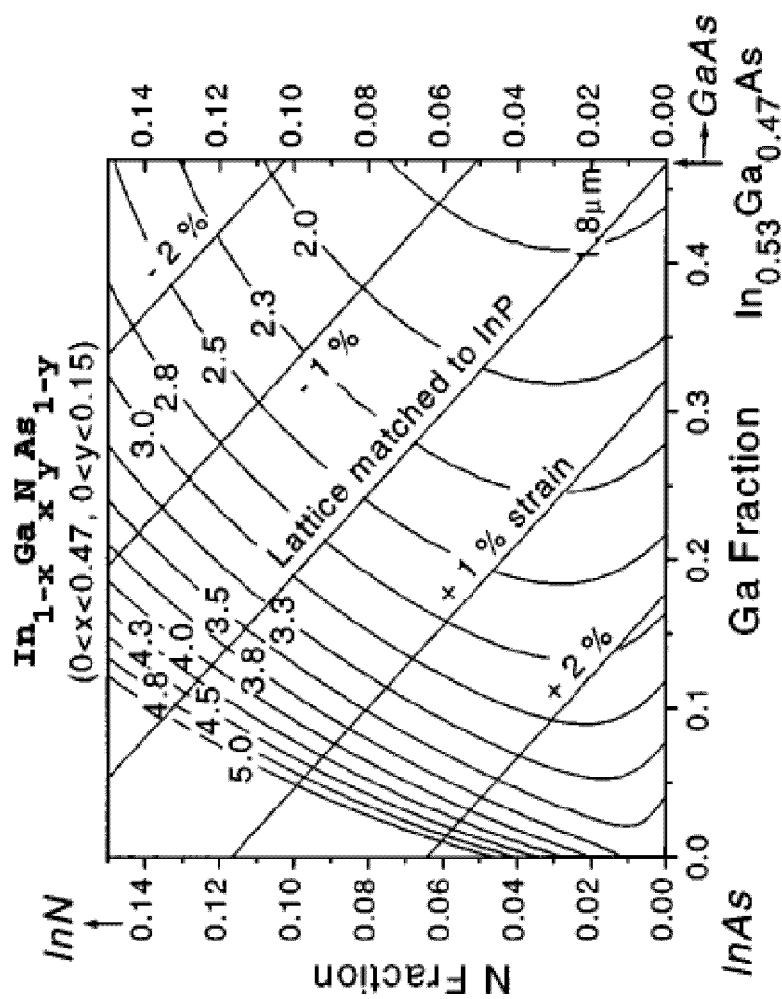
FIG. 4 illustrates the approximate theoretical relationship between the N content and the bandgap of the InGaAsN material.

FIG. 4, reproduced from M. Gokhale, J. Wei, H. Wang, S. Forrest, "Growth and characterization of small band gap (~0.6 eV) InGaAsN layers on InP," Applied Physics Letters, Vol. 74, pp. 1287-9 (1999), shows the approximate theoretical relationship between the N content and the bandgap of the InGaAsN. Not shown is the Sb incorporated in the preferred embodiment of this invention.

Because the InGaAsSbN photoabsorbing layer is lattice-matched to the InP substrate, there is no need for a buffer layer that reduces the number of defects. Therefore the short end of the wavelength range is only limited by InP to be 920 nm, and not a longer wavelength. The wavelength range can be further extended into the visible by removing the substrate through a combination of mechanical lapping and wet etching. Alternatively, the layer 6 can be replaced by AlInAs which has a bandgap slightly lower than InP so that following substrate removal, the onset of optical absorption will be about 0.83 microns.

Detector Structures

Figure 5:
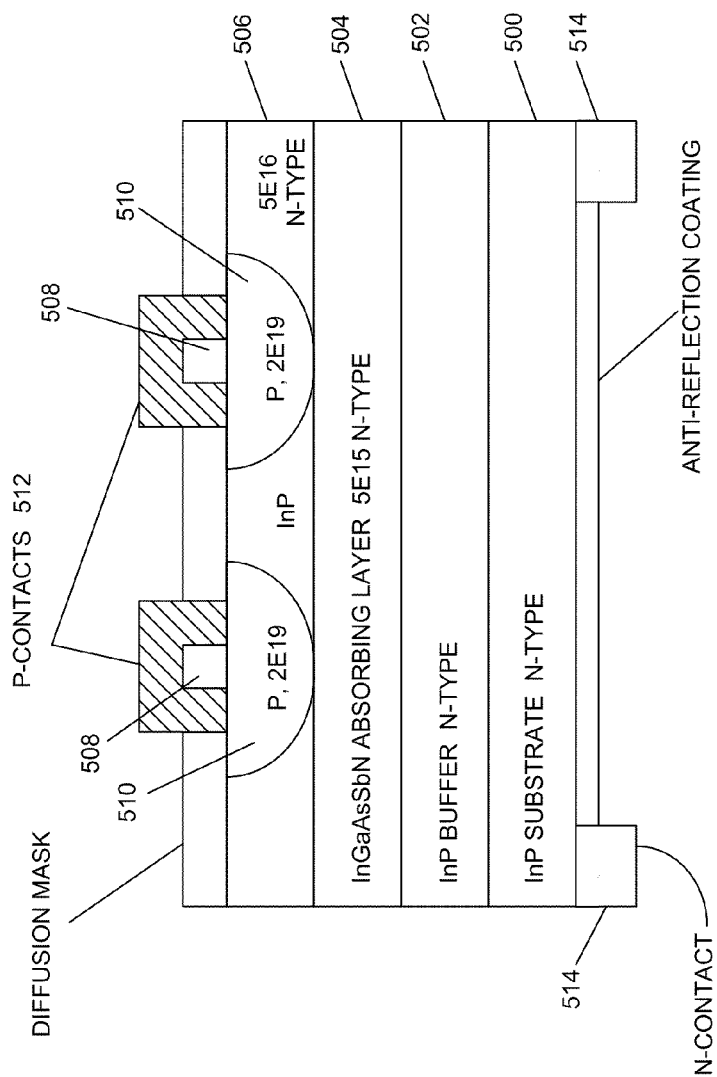
FIG. 5 illustrates an embodiment of a planar PIN photodetector using lattice-matched $In_xGa_{1-x}As_{1-y-z}Sb_yN_z$ as the photoabsorber material in accordance with one or more embodiments of the present invention.

FIG. 5 illustrates an embodiment of a planar PIN photodetector using lattice-matched $In_xGa_{1-x}As_{1-y-z}Sb_yN_z$ as the photoabsorber material in accordance with one or more embodiments of the present invention.

The structure shown in FIG. 5 is grown on an n-type InP substrate 500. In other embodiments where high switching speed is required, the structure can also be grown on a semi-insulating InP substrate 500. The first layer is the n-type InP window layer 502 which provides a barrier to photocarriers generated within the absorbing area. The next layer is the photoabsorbing layer 504, and it is composed of $In_xGa_{1-x}As_{1-y-z}Sb_yN_z$. The photoabsorbing layer 504 can be undoped or lightly n-doped at approximately 5E15 cm−3. In the preferred embodiment, this layer is 3.5 ums thick, but it can range from 0.1-7 ums, depending on the application. Above the photoabsorbing layer 504, a lightly n-doped InP layer 506 is grown. This layer is typically 1 micron thick, but can be of any thickness without departing from the scope of the present invention. The top layer is the InGaAs contact layer 508, which is typically 0.2 microns thick, but can be of any thickness without departing from the scope of the present invention. The top layer 508 is also typically undoped. In the planar structure, the InGaAs contact layer 508 is etched into a mesa, and then Zn is typically diffused into the cap structure in areas 510 to make it p-type and define the PIN junction. The Zn diffuses through the InP layer 506 until it reaches the photoabsorbing layer 504. The p-side 512 and n-side 514 contacts are provided to fully form the detector.

Figure 6:
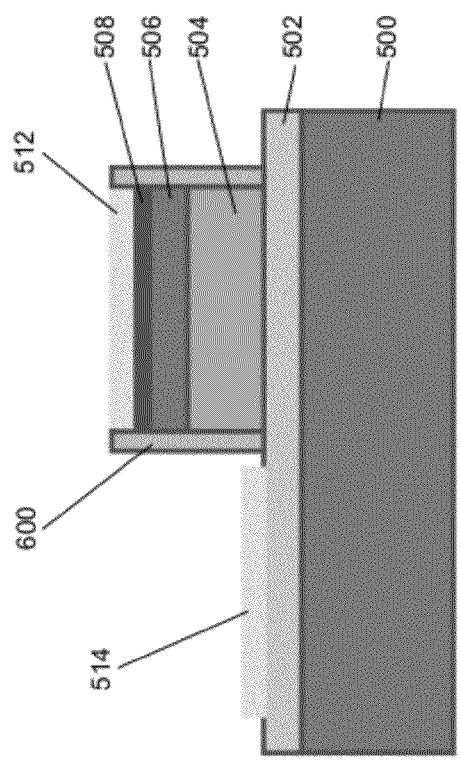
FIG. 6 illustrates another embodiment where the $In_xG_{1-x}As_{1-y-z}Sb_yN_z$ is used in a mesa PIN photodetector.
Figure 6:
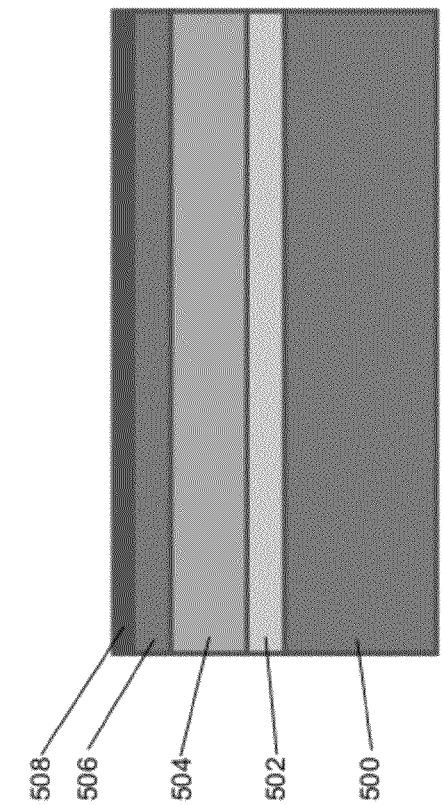

FIG. 6 illustrates another embodiment where the $In_xGa_{1-x}As_{1-y-z}Sb_yN_z$ is used in a mesa PIN photodetector. In this embodiment, the structure is grown on a n-type or semi-insulating InP substrate 500. A first InP layer 502 is grown to be 1 micron and n-type. The photoabsorbing layer 504, $In_xGa_{1-x}As_{1-y-z}Sb_yN_z$, is grown to be 3.5 microns and lightly n-type. A second InP layer 506 is grown to be 1 micron and p-type. Finally, an InGaAs contact layer 508 is grown to be 0.2 microns and heavily p-type. The device is defined photolithographically into a circle or square, and the outer edge is etched away. A passivation layer 600 is deposited on the edges to minimize leakage current. Metallic contacts 512 and 514 are deposited on the p-layer 508 and n-layer 502.

Figure 7:
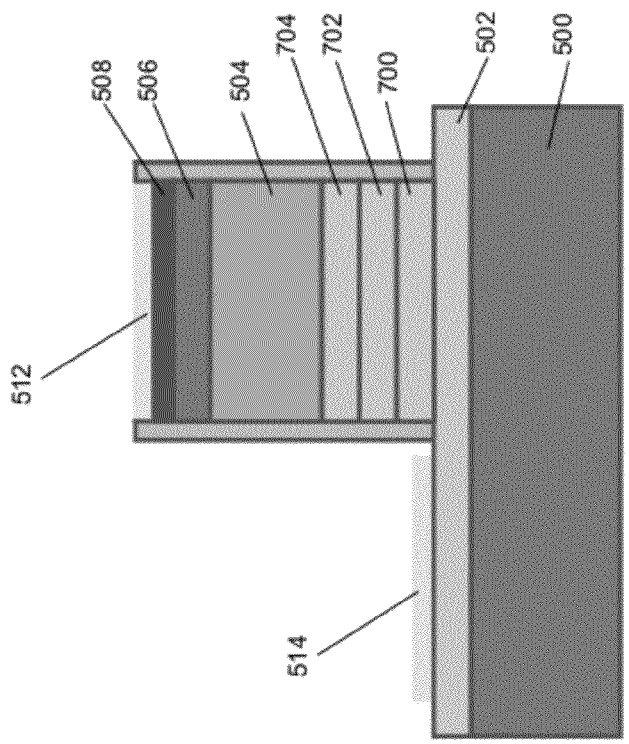
FIG. 7 illustrates another embodiment where the $In_xGa_{1-x}As_{1-y-z}Sb_yN_z$ is used in an Avalanche Photodetector.
Figure 7:
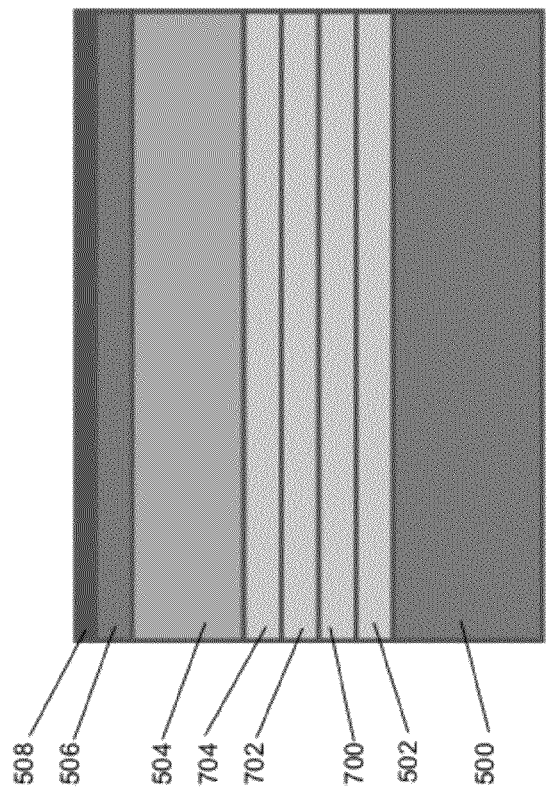

FIG. 7 illustrates another embodiment where the $In_xGa_{1-x}As_{1-y-z}Sb_yN_z$ is used in an Avalanche Photodetector. The layer structure comprises an InP substrate 500 that is comprised of one of an n-type dopants or semi-insulating dopants; an n-doped InP buffer layer 502; an n-doped AlInAs field stop layer 700; an undoped AlInAs multiplication layer 702; a p-doped AlInAs field charge layer 704; an undoped photoabsorbing layer 504 made using $In_xGa_{1-x}As_{1-y-z}Sb_yN_z$; a p-doped InP contact layer 506; and a p-doped InGaAs contact layer 508. Diodes are formed by etching mesas and passivating the sidewalls. Metallic contacts 512 and 514 are made on both the p-InGaAs contact layer and on the n-doped InP buffer. This structure will provide high-gain, low noise photodetector performance and be sensitive to wavelengths beyond 2.5 microns. This structure is challenging to make with $In_{0.75}Ga_{0.25}As$ photoabsorbing layer 508 because said layer has a high number of defects which lead to high dark current. Other Avalanche Photodetector designs can be implemented with the scope of the present invention.

In all of these embodiments, the single detector can also be made into an array of detectors. For imaging applications, these detector arrays would typically be bump-bonded to a readout integrated circuit.

Conclusion

In summary, the present invention describes embodiments of detectors made using lattice matched photoabsorbing layers.

A photodiode apparatus in accordance with one or more embodiments of the present invention comprises an indium phosphide substrate, and a photoabsorbing region comprising at least an indium gallium arsenide antimonide nitride (InGaAsSbN) layer, wherein the InGaAsSbN layer has a thickness of at least 100 nanometers and is nominally lattice-matched to the indium phosphide substrate.

Such a photodiode apparatus further optionally comprises the photoabsorbing region having a cutoff wavelength greater than 1.7 microns, the cutoff wavelength being measured at 25 degrees celsius, the cutoff wavelength being less than 3 microns, the thickness of the InGaAsSbN layer being between 0.05 microns and 7 microns, the InGaAsSbN layer comprising a concentration of 0.5% to 15% of antimonide, the InGaAsSbN layer comprising a concentration of 0.5% to 15% of nitrogen, the InGaAsSbN layer comprising a concentration greater than 40% of indium, and the indium phosphide substrate being substantially removed.

Another photodiode apparatus in accordance with one or more embodiments of the present invention comprises an indium phosphide substrate, a first layer region coupled to the indium phosphide, the first layer comprising at least a layer of indium phosphide doped n-type material, a second layer region, coupled to the first layer region, the second layer region comprising at least an indium gallium arsenide antimonide nitride (InGaAsSbN) layer, the InGaAsSbN layer having a thickness of at least 100 nanometers and being nominally lattice-matched to said substrate, a third layer region comprising a layer of indium phosphide, a fourth layer region comprising a patterned p-type layer of indium gallium arsenide, and a fifth layer region comprising a dopant diffused region which extends from said third layer region into said second layer region.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the full range of equivalents to the claims thereof.

What is claimed is:

1. A photodiode apparatus, comprising:
an indium phosphide substrate; and
a photoabsorbing region comprising at least an $indium_x$ $gallium_{1-x}$ arsenide antimonide nitride (InGaAsSbN) layer, wherein the InGaAsSbN layer has a thickness of at least 350 nanometers, the InGaAsSbN layer having a strain of within 0.3 percent of a lattice match between the indium phosphide substrate and the In GaAsSbN layer, and wherein x is greater than 0.53.

2. The photodiode apparatus of claim 1, wherein the photoabsorbing region has a cutoff wavelength greater than 1.7 microns.

3. The photodiode apparatus of claim 2, wherein the cutoff wavelength is measured at 25 degrees celsius.

4. The photodiode apparatus of claim 3, wherein the cutoff wavelength is less than 5 microns.

5. The photodiode apparatus of claim 1, wherein the thickness of the InGaAsSbN layer is between 0.05 microns and 10 microns.

6. The photodiode apparatus of claim 1, wherein the InGaAsSbN layer comprises a concentration of 0.5% to 15% of antimonide.

7. The photodiode apparatus of claim 1, wherein the InGaAsSbN layer comprises a concentration of 0.5% to 15% of nitrogen.

8. The photodiode apparatus of claim 1, wherein the InGaAsSbN layer comprises a concentration of 75% of indium.

9. The photodiode apparatus of claim 1, wherein the indium phosphide substrate is substantially removed.

10. A photodiode apparatus, comprising:
an indium phosphide substrate;
a first layer region coupled to the indium phosphide; and a second layer region, coupled to the first layer region, the second layer region comprising at least an indium gallium arsenide antimonide nitride ($In_xGa_{1-x}AsSbN$) layer, the $In_xGa_{1-x}AsSbN$ layer having a thickness of at least 350 nanometers and having a strain of within 0.3 percent of a lattice match between the indium phosphide substrate and the $In_xGa_{1-x}AsSbN$ layer, wherein the first layer region comprises at least a layer of material with a wider bandgap than the $In_xGa_{1-x}AsSbN$ layer in the second layer region, and wherein x is greater than 0.53.

11. The photodiode apparatus of claim 10, wherein the second layer region has a cutoff wavelength greater than 1.7 microns.

12. The photodiode apparatus of claim 11, wherein the cutoff wavelength is measured at 25 degrees celsius.

13. The photodiode apparatus of claim 12, wherein the cutoff wavelength is less than 5 microns.

14. The photodiode apparatus of claim 10, wherein the thickness of the InGaAsSbN layer is between 0.05 microns and 10 microns.

15. The photodiode apparatus of claim 10, wherein the InGaAsSbN layer comprises a concentration of 0.5% to 15% of antimonide.

16. The photodiode apparatus of claim 10, wherein the InGaAsSbN layer comprises a concentration of 0.5% to 15% of nitrogen.

17. The photodiode apparatus of claim 10, wherein the InGaAsSbN layer comprises a concentration of 75% of indium.

18. The photodiode apparatus of claim 10, wherein the indium phosphide substrate is substantially removed.

* * * * *